United States Patent
Harada et al.

(10) Patent No.: US 10,637,008 B2
(45) Date of Patent: Apr. 28, 2020

(54) DISPLAY DEVICE

(71) Applicant: Japan Display Inc., Tokyo (JP)

(72) Inventors: Keisuke Harada, Tokyo (JP); Kenta Kajiyama, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 16/191,567

(22) Filed: Nov. 15, 2018

(65) Prior Publication Data

US 2019/0165333 A1     May 30, 2019

(30) Foreign Application Priority Data

Nov. 28, 2017 (JP) ................. 2017-228227

(51) Int. Cl.
| | |
|---|---|
| *H01L 51/56* | (2006.01) |
| *H01L 51/00* | (2006.01) |
| *H01L 27/32* | (2006.01) |
| *H01L 51/52* | (2006.01) |
| *G09F 9/30* | (2006.01) |
| *G09G 3/3233* | (2016.01) |

(52) U.S. Cl.
CPC ............. *H01L 51/56* (2013.01); *G09F 9/301* (2013.01); *G09G 3/3233* (2013.01); *H01L 27/3246* (2013.01); *H01L 27/3255* (2013.01); *H01L 27/3276* (2013.01); *H01L 51/0097* (2013.01); *H01L 51/5206* (2013.01); *H01L 51/5221* (2013.01); *H01L 51/5246* (2013.01); *H01L 51/5253* (2013.01); *H01L 2251/5338* (2013.01)

(58) Field of Classification Search
None
See application file for complete search history.

(56) References Cited

U.S. PATENT DOCUMENTS

| | | |
|---|---|---|
| 2009/0051640 A1 | 2/2009 | Tanaka et al. |
| 2014/0216790 A1* | 8/2014 | Trauernicht ............ G06F 3/044 174/253 |
| 2017/0179210 A1* | 6/2017 | Kimura ............... H01L 27/3258 |

FOREIGN PATENT DOCUMENTS

JP     2009-048007 A     3/2009

* cited by examiner

*Primary Examiner* — Jay C Chang
(74) *Attorney, Agent, or Firm* — Michael Best & Friedrich LLP

(57) ABSTRACT

A display device includes a substrate having flexibility, a display region including a plurality of pixels above the substrate, a periphery region on an outer side of the display region above the substrate, a first wiring arranged in the periphery region and extending in a first direction, a first insulation layer above the first wiring, and a second wiring extending in a second direction intersecting the first direction above the first insulation layer, wherein the first wiring includes a first bent part, the second wiring includes a second bent part, and the first bent part overlaps the second wiring and the second bent part overlaps the first wiring in a region where the first wiring and the second wiring intersect.

11 Claims, 18 Drawing Sheets

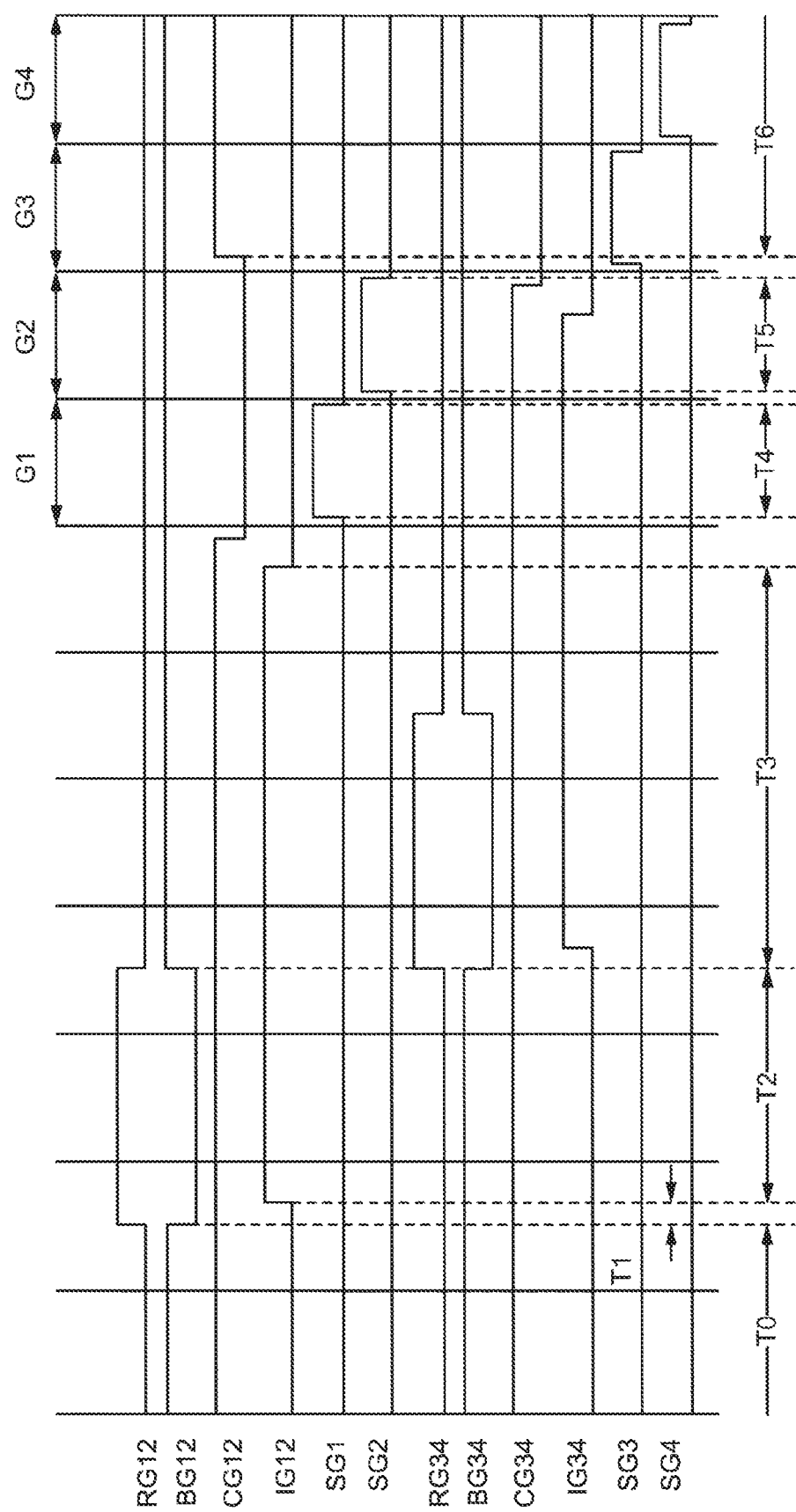

DISPLAY DEVICE

CROSS REFERENCE TO RELATED APPLICATIONS

This application is based upon and claims the benefit of priority from the prior Japanese Patent Application No. 2017-228227, filed on Nov. 28, 2017, the entire contents of which are incorporated herein by reference.

FIELD

One embodiment of the present invention is related to a display device. One embodiment of the present invention is related to a structure of wiring in a display device.

BACKGROUND

An organic electroluminescence (referred to herein as organic EL) display device is arranged with a light emitting element in each pixel and displays an image by individually controlling the emitted light. A light-emitting element includes a structure in which a layer (referred to herein as "light emitting layer") including an organic EL material is sandwiched between a pair of electrodes distinguished as an anode electrode and cathode electrode. When electrons from the cathode and holes from the anode are injected to the light emitting layer, the electrons and holes recombine. Light emitting molecules within the light emitting layer are excited by a surplus energy output by this recombination and subsequently emit light due to de-excitation.

In the organic EL display device, each anode of a light emitting element is arranged as a pixel electrode in each pixel and the cathode is arranged as a common electrode which bridges a plurality of pixels and is applied with a common voltage. The organic EL display device controls the light emitted by a pixel by applying the voltage of the pixel electrode to each pixel with respect to the voltage of the common electrode.

In recent years, flexible display devices which have display regions which can be folded have been actively developed. Wiring formed in the display region of a flexible display device has a problem whereby stress is concentrated when the display device is bent which makes it easier to disconnect.

In response to such a problem, a technique is disclosed in which a data line extending in one direction is formed not in a straight line but in a crank shape or in an S shape when a flexible display device is curved in one direction (for example, Japanese Laid Open Patent Publication No. 2009-48007).

SUMMARY

A display device in an embodiment of the present invention includes a substrate having flexibility, a display region including a plurality of pixels above the substrate, a periphery region on an outer side of the display region above the substrate, a first wiring arranged in the periphery region and extending in a first direction, a first insulation layer above the first wiring, and a second wiring extending in a second direction intersecting the first direction above the first insulation layer, wherein the first wiring includes a first bent part, the second wiring includes a second bent part, and the first bent part overlaps the second wiring and the second bent part overlaps the first wiring in a region where the first wiring and the second wiring intersect.

A display device in an embodiment of the present invention includes a substrate having flexibility, a display region including a plurality of pixels above the substrate, a periphery region on an outer side of the display region above the substrate, a first wiring arranged in the periphery region and extending in a first direction, a first insulation layer above the first wiring, and a second wiring extending in a second direction intersecting the first direction above the first insulation layer, wherein the first wiring includes a first bent part, the second wiring includes a second bent part, and the first bent part overlaps the second wiring and the second bent part overlaps the first wiring in a region where the first wiring and the second wiring intersect.

BRIEF DESCRIPTION OF DRAWINGS

FIG. 17 is a timing chart of a display device related to one embodiment of the present invention.

DESCRIPTION OF EMBODIMENTS

Figure 1:
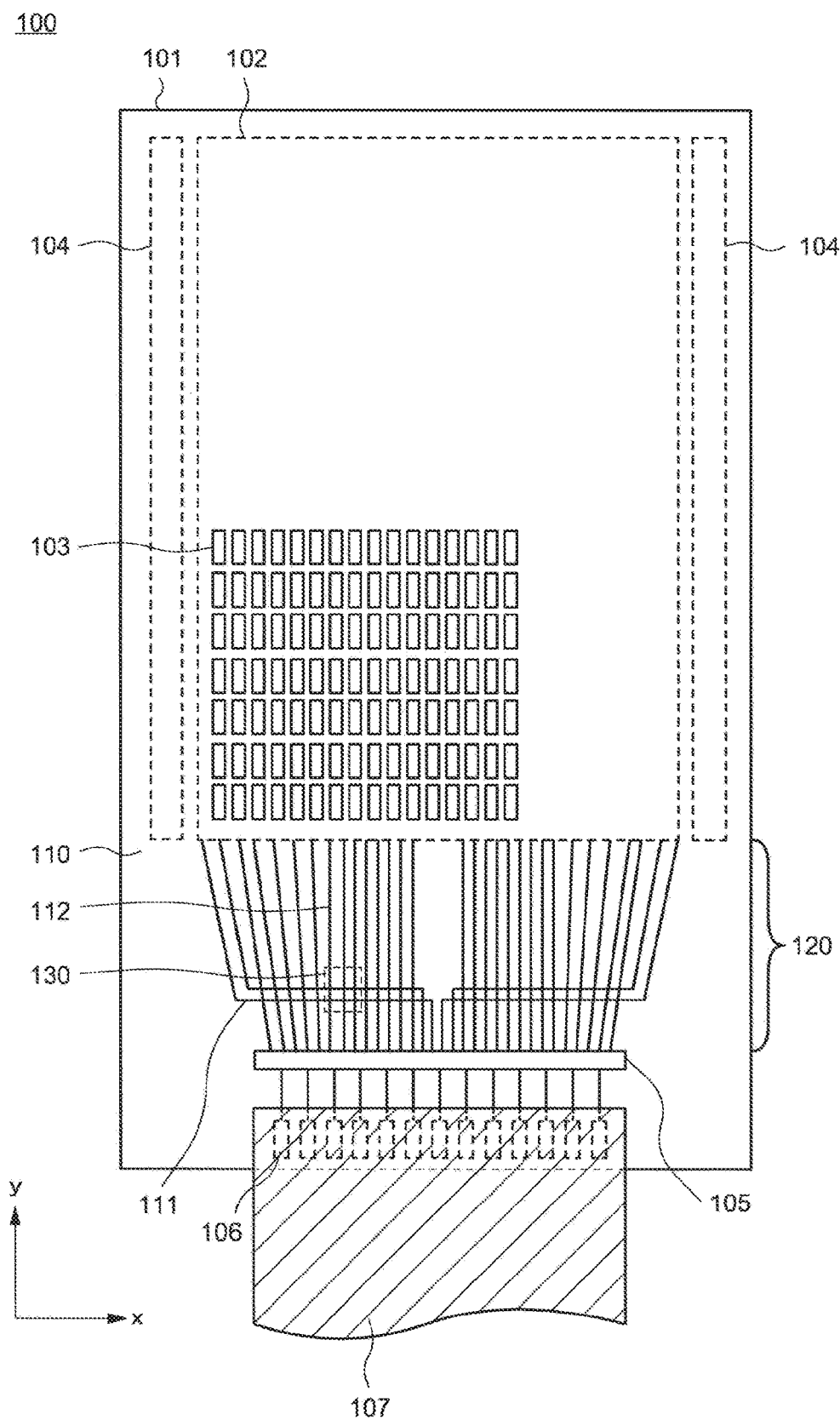
FIG. 1 is a plan view for explaining the structure of a display device related to one embodiment of the present invention.

The embodiments of the present invention are explained below while referring to the drawings. However, it is possible to perform the present invention using various different forms, and the present invention should not be interpreted as being limited to the content described in the embodiments exemplified herein. In addition, although the width, thickness and shape of each component are shown schematically compared to their actual form in order to better clarify explanation, the drawings are merely an example and should not limit an interpretation of the present invention. In addition, in the specification and each drawing, the same reference symbols are attached to similar elements and elements that have been mentioned in previous drawings, and therefore a detailed explanation may be omitted where appropriate.

First Embodiment

A display device according to the present embodiment is explained while referring to FIG. 1 to FIG. 6.

Structure of Display Device

FIG. 1 is a plan view showing a structure of a display device 100 according to the present embodiment. The display device 100 includes a substrate 101, a display region 102 and a periphery region 110. The substrate 101 has flexibility. The display region 102 is arranged above the substrate 101. In addition, the display region 102 includes a plurality of pixels 103. The plurality of pixels 103 are arranged in a matrix shape.

The periphery region 110 is arranged to surround the display region 102. The periphery region 110 refers to a region from the display region 102 to the end part of the substrate 101. In other words, the periphery region 110 is defined as a region other than a region where the display region 102 is arranged on the substrate 101 (that is, a region on the other side of the display region 102). The periphery region 110 includes a drive circuit 104 and a terminal 106. The drive circuit 104 is arranged to sandwich the display region 102. In addition, a driver IC 105 may be arranged in the periphery region 110. The driver IC is connected to the terminal 106. The terminal 106 is connected to a flexible printed circuit 107.

The drive circuit 104 is connected to a scanning line which is connected to a pixel 103, and functions as a scanning line drive circuit. In addition, the driver IC 105 is connected to a signal line which is connected to a pixel 103 and incorporates a signal line drive circuit. Furthermore, although an example in which a signal line drive circuit is incorporated in the driver IC 105 is shown in FIG. 1, apart from the driver IC 105, a signal line drive circuit may also be arranged on the substrate 101.

The driver IC 105 may be arranged on the substrate 101 in a form such as an IC chip. In addition, although not shown in the drawing, the driver IC 105 may also be arranged on the flexible printed circuit 107.

An image signal is provided to each pixel 103 from a driver IC 105 via a signal line. In addition, a signal for selecting each pixel 103 is provided to each pixel 103 from the driver IC 105 via the drive circuit 104 and the scanning line. Using these signals, it is possible to drive a transistor included in the pixel 103 and perform screen display according to the image signal.

In the periphery region 110, a folding region 120 of the display device 100 is arranged between the display region 102 and the driver IC 105. A wiring 111 and a wiring 112 are arranged in the folding region 120. The wiring 111 connects a plurality of pixels 103 and the driver IC 105. Similarly, the wiring 112 connects a plurality of pixels 103 and the driver IC 105. An insulating layer (not shown in the drawing) is arranged above the wiring 111, and the wiring 112 is arranged above the insulating layer.

In the folding region 120, the wiring 111 has a part which extends in the first direction (x direction in FIG. 1). A part of the wiring 111 may also extend in the second direction. In addition, in the folding region 120, the wiring 112 has a part which extends in the second direction (y direction in FIG. 1). As shown in FIG. 1, although the wiring 111 and the wiring 112 intersect each other, they do not have to be orthogonal to each other. For example, the first direction may be misaligned by ±30° with respect to the x axis. In addition, the second direction may be misaligned by ±30° with respect to the y axis, for example.

Figure 2:
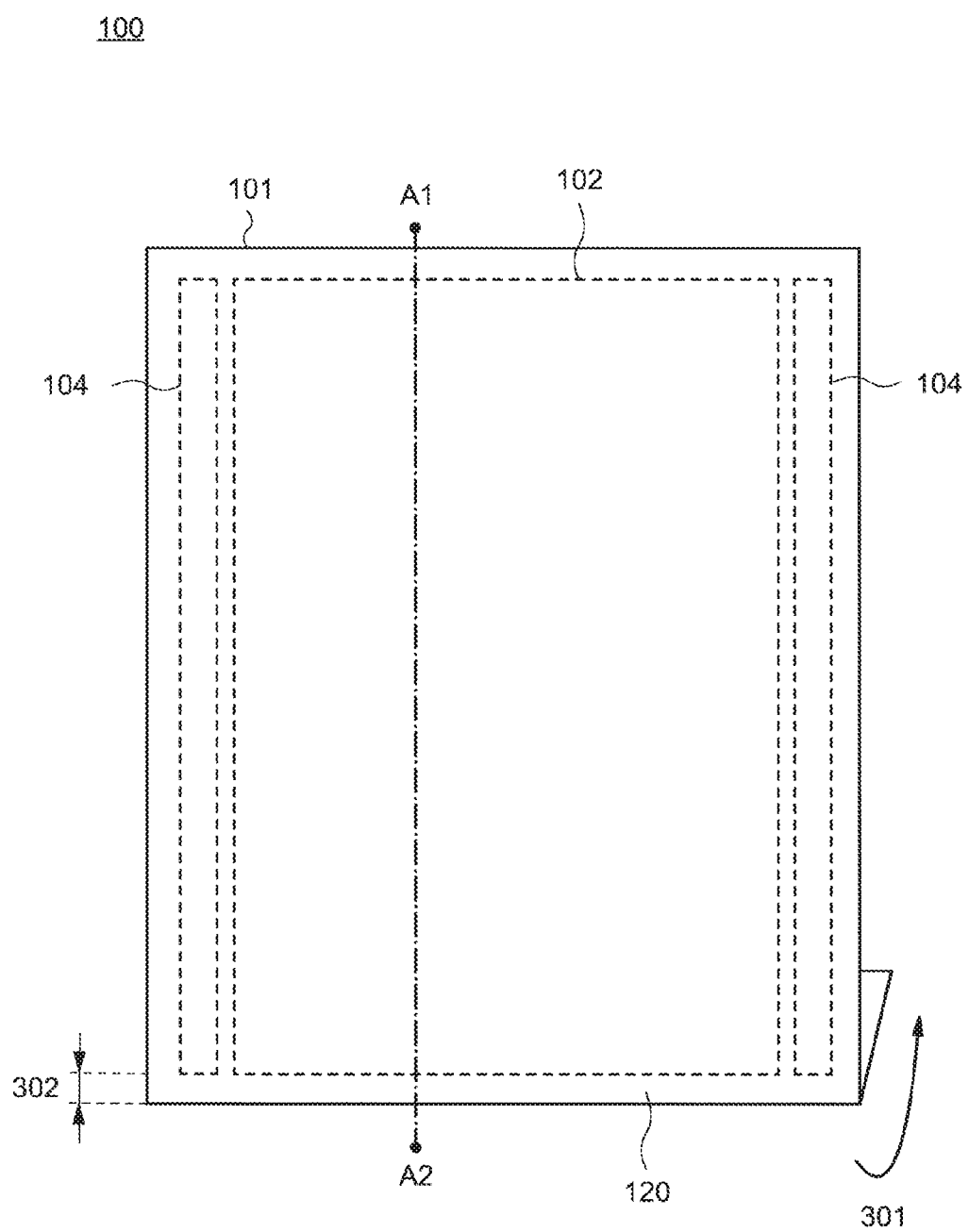
FIG. 2 is a plan view for explaining the structure of a display device related to one embodiment of the present invention.

FIG. 2 is a drawing showing a state in which the display device 100 is folded in the folding region 120. In addition, FIG. 3 is a cross-sectional view along the line A1-A2 shown in FIG. 2.

Figure 3:
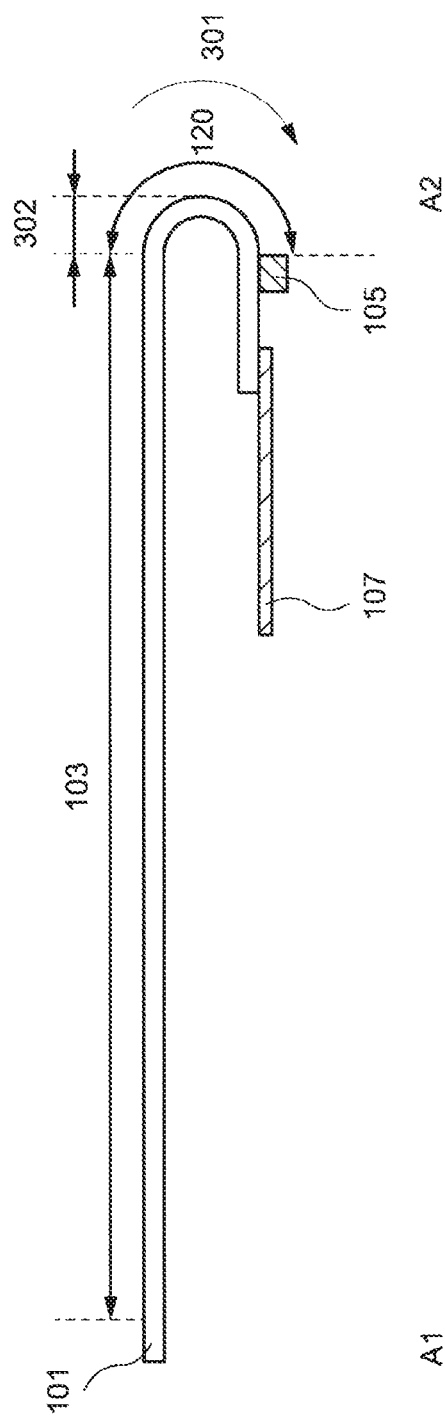
FIG. 3 is a cross-sectional view for explaining the structure of a display device related to one embodiment of the present invention.

As shown in FIG. 2 and FIG. 3, the substrate 101 is folded in the direction of the arrow 301 in the folding region 120 which is arranged between the display region 102 and the driver IC 105. As shown in FIG. 3, the substrate 101 is folded so that the driver IC 105 and the flexible printed circuit 107 overlap the rear side of the display region 102. In this way, when the display device 100 is applied to an electronic device such as a smartphone, it is possible to reduce the width 302 of the periphery region 110.

Stress is generated in the folding bending region 120 by folding the substrate 101 in the direction of the arrow 301. At this time, stress due to folding of the substrate 101 is concentrated in a region where the wiring 111 extending in the first direction intersects the wiring 112 extending in the second direction.

Figure 4A:
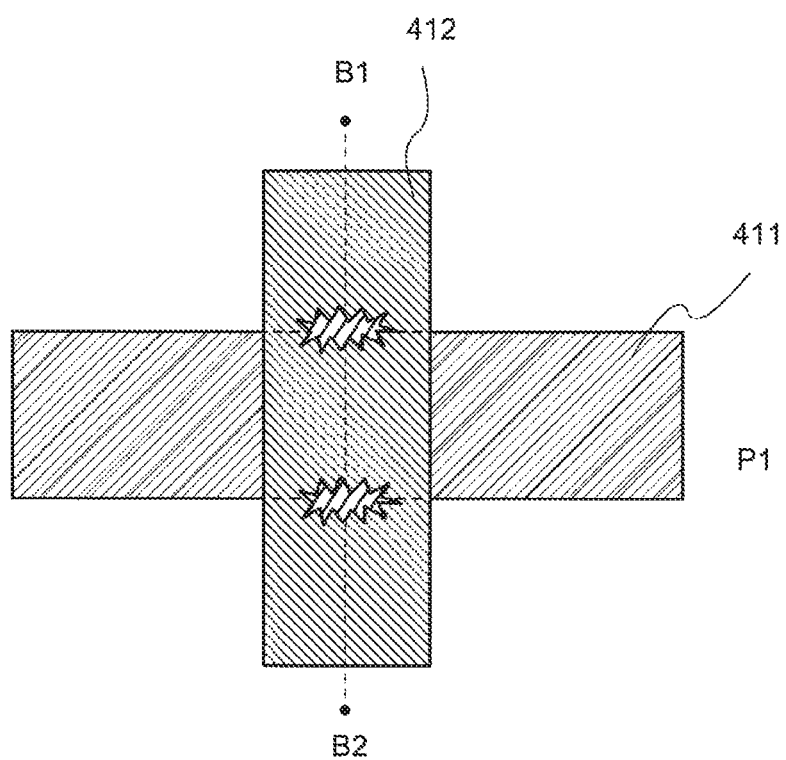
FIG. 4A is a plan view of an intersection part of two wires in a conventional display device.
Figure 4B:
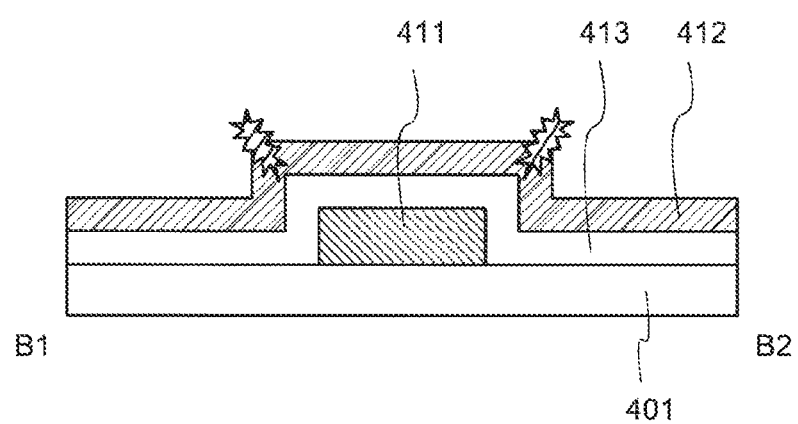
FIG. 4B is a cross-sectional view along the line B1-B2 shown in FIG. 4A.

FIG. 4A and FIG. 4B are enlarged views of a region where two wirings arranged in a conventional display device intersect. FIG. 4A is a plan view of an intersection part of the two wires, and FIG. 4B is a cross-sectional view along line B1-B2 shown in FIG. 4A.

As shown in FIG. 4A, a wiring 411 extends in the first direction, and the wiring 412 extends in the second direction. In addition, as shown in FIG. 4B, the wiring 411 is arranged above a substrate 401, an insulating layer 413 is arranged above the wiring 411, and the wiring 412 is arranged above the insulating layer.

Although a data line which extends in a first direction is not a straight line but a crank shape or an S shape in the structure of the wiring arranged in the conventional display device, a selection line (also called a gate line) extending in a direction intersecting the first direction is a straight line. That is, a crank shaped or S shaped data line is arranged above a straight selection line via an interlayer insulating film.

When a flexible display device is bent in one direction, stress concentrates in a region where a selection line and a data line intersect. In particular, stress concentrates on a step part of a data line in an upper layer which crosses a selection line. As a result, there is a problem whereby the data line easily disconnects along an end part of the selection line.

Specifically, when the substrate of the display device is folded, stress concentrates in a region where the wiring 411 and the wiring 412 intersect. In particular, stress concentrates on a step part of the wiring 412 in the upper layer which crosses the end part of the wiring 411. As a result, there is a problem whereby the wiring 412 easily disconnects along the end part of the wiring 411.

In one embodiment of the present invention, a bent part is arranged in each of a wiring extending in a first direction and a wiring extending in a second direction. In addition, in a region where the wiring extending in the first direction intersects the wiring extending in the second direction, the bent part of one wiring overlaps with the other wiring in a planar view.

Figure 5:
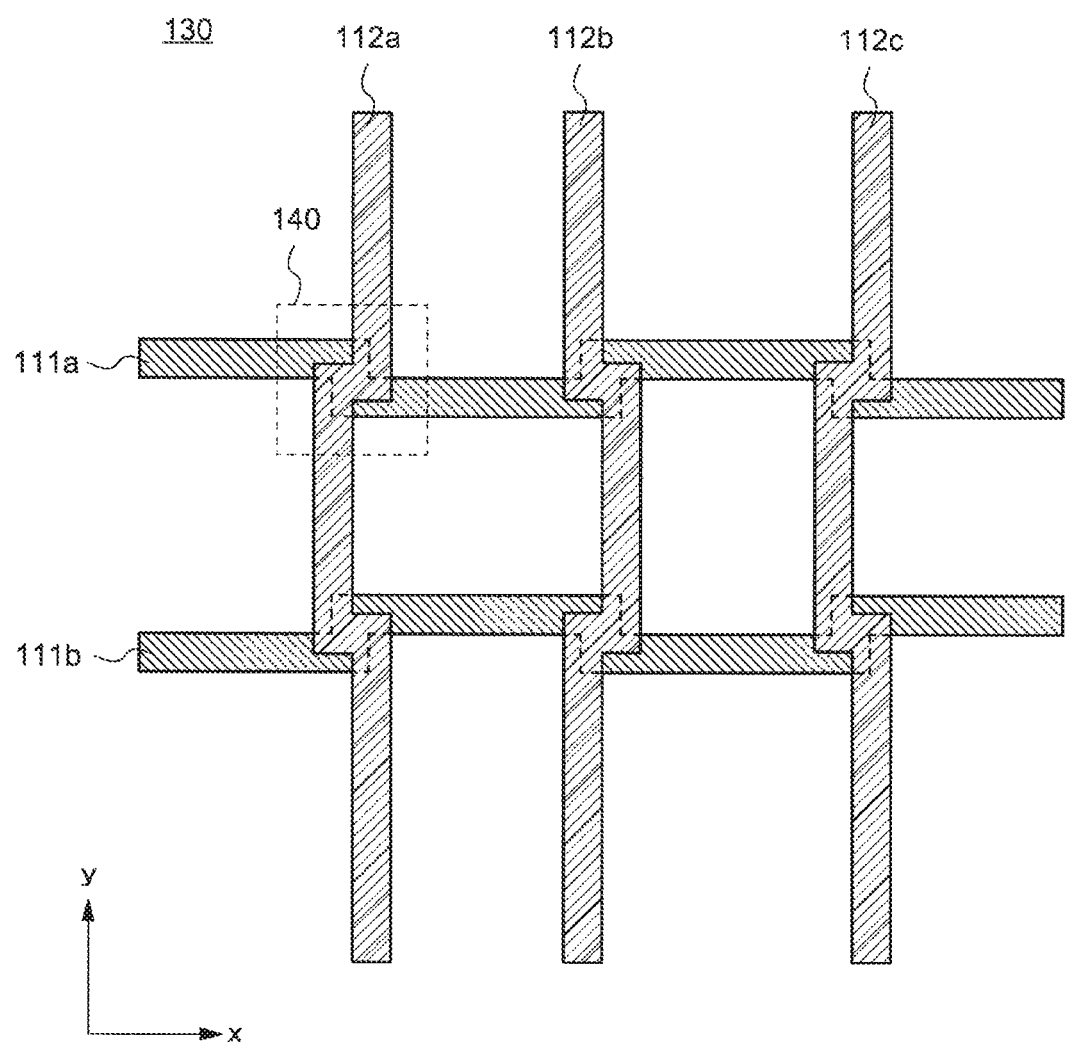
FIG. 5 is an enlarged view of a part of a display device related to one embodiment of the present invention.

FIG. 5 is an enlarged view of a region 130 shown in FIG. 1. As shown in FIG. 5, wirings 111a and 111b are arranged in the first direction, and wirings 112a to 112c are arranged in the second direction. An insulating layer is arranged between the wirings 111a and 111b and the wirings 112a to 112c. An illustration of the insulating layer is omitted.

Each of the wirings 111a and 111b has at least one bent part. In addition, each of the wirings 112a to 112c has at least one bent part. In a region 140 where the wiring 111a and the wiring 112a intersect each other, the bent part of the wiring 112a overlaps the wiring 111a.

Figure 6:
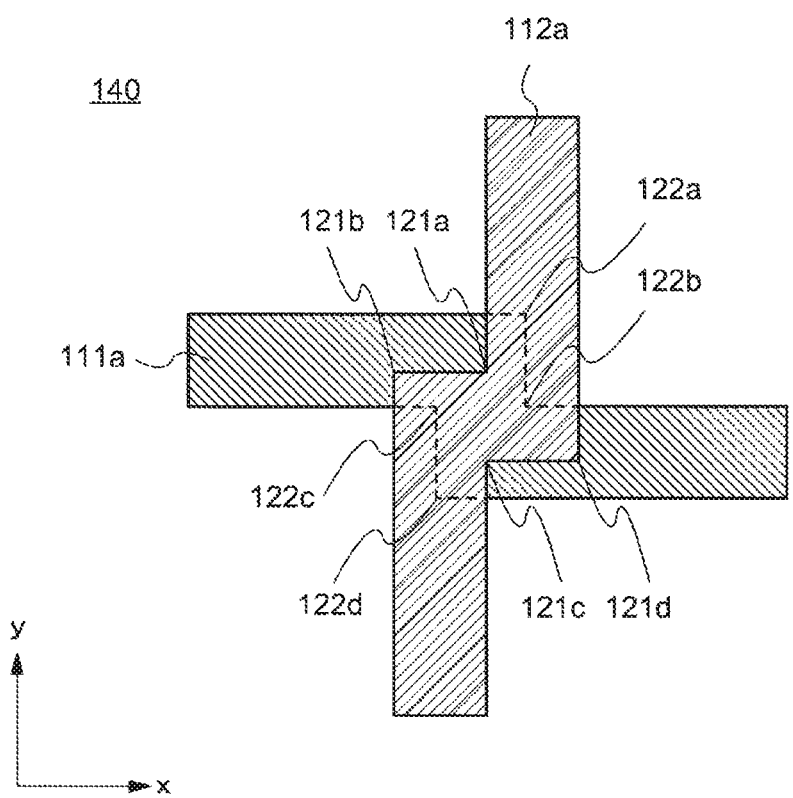
FIG. 6 is an enlarged view of a part of a display device related to one embodiment of the present invention.

FIG. 6 is an enlarged view of the region 140 shown in FIG. 5. The wiring 111a overlaps corner parts 122a to 122d of the bent part of the wiring 112a. In addition, the wiring 112a overlaps corner parts 121a to 121d of the bent part of the wiring 111. That is, the wiring 112a does not overlap the linear region of the wiring 111a, and the wiring 111a does not overlap the linear region of the wiring 112a. Furthermore, in the present specification, the corner parts of a bent part mean two lines are folded and have an angle when viewed in a planar view.

As was explained above, in the region where wiring extending in the first direction intersects wiring extending in the second direction, the bent part of one wiring overlaps the other wiring. In this way, even if the substrate 101 is folded in the folding region 120, the stress applied to the wiring 112a can be dispersed in the region where the wiring 111a and the wiring 112a intersect. Therefore, disconnection of the wiring 112a due to the wiring 111a does not easily occur. In addition, since it is difficult for the wiring 112a to disconnect, it is possible to improve reliability of the display device 100.

Second Embodiment

Figure 7:
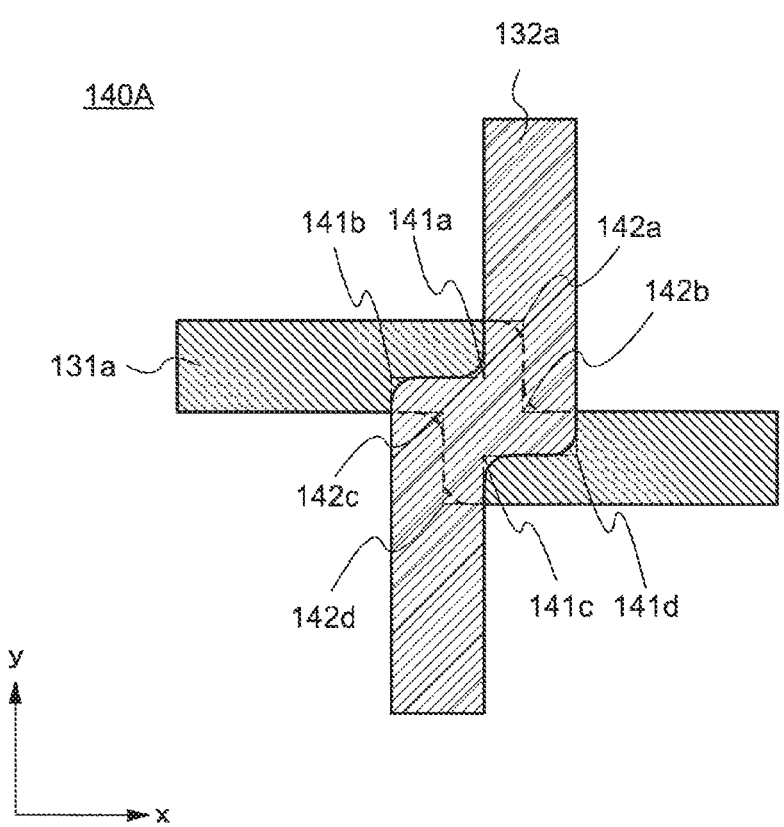
FIG. 7 is an enlarged view of a part of a display device related to one embodiment of the present invention.

In the present embodiment, a structure of a region 140A which is partially different from the structure of the region 140 shown in FIG. 6 is explained while referring to FIG. 7.

FIG. 7 is a drawing showing the region 140A in which the structure of the region 140 shown in FIG. 6 is partially changed. As shown in FIG. 7, a wiring 131a is arranged in the first direction, and a wiring 132a is arranged in the second direction. Furthermore, an insulating layer is arranged between the wiring 131a and the wiring 132a. In the region 140A where the wiring 131a and the wiring 132a intersect each other, the wiring 132a overlaps a bent part of the wiring 131a. In addition, the wiring 131a overlaps a bent part of the wiring 132a.

The wiring 131a overlaps the corner parts 142a to 142d of the bent part of the wiring 132a. In addition, the wiring 132a overlaps the corner parts 141a to 141d of the bent part of the wiring 131. Here, the corner parts 141a to 141d of the bent part of the wiring 131a are rounded. The corners 142a to 142d of the bent part of the wiring 132a are rounded. Here, the fact that the corner parts are rounded means that the corner parts of the wiring are not a shape having an obtuse apex, but they have a curve. In FIG. 7, the two-dot chain line indicates a corner part of the bent part, and the solid line and the dotted line indicate the shapes of the actual wiring 131a and the wiring 132a.

Therefore, even if the substrate 101 is folded in the folding region 120, by making the corner part of the bent part into a shape which does not have an obtuse apex in the region where the wiring 131a and the wiring 132a intersect, stress concentration on the obtuse apex part is avoided, and it is possible to further disperse the stress applied to the wiring 132a. Therefore, disconnection of the wiring 132a due to the wiring 131a does not easily occur. In addition, since the wiring 132a is does not easily disconnect, it is possible to improve the reliability of the display device 100.

Third Embodiment

Figure 8:
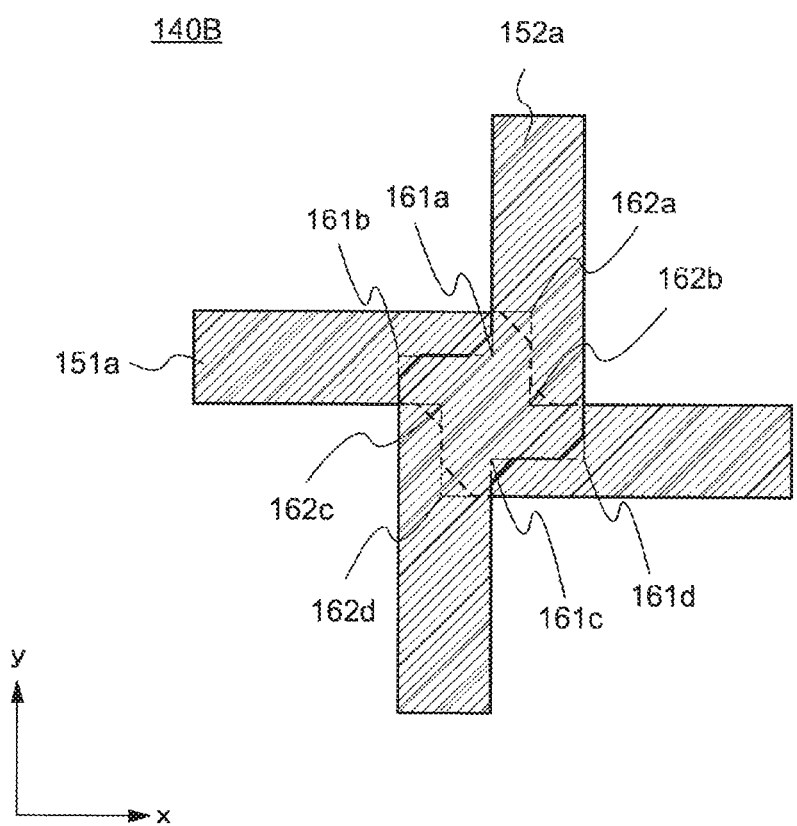
FIG. 8 is an enlarged view of a part of a display device related to one embodiment of the present invention.

In the present embodiment, a structure of a region 140B which is partially different from the structure of the region 140 shown in FIG. 6 is explained while referring to FIG. 8.

FIG. 8 is a drawing showing the region 140B in which the structure of the region 140 shown in FIG. 6 is partially changed. As shown in FIG. 8, a wiring 151a is arranged in the first direction and the wiring 152a is arranged in the second direction. Furthermore, an insulating layer is arranged between the wiring 151a and the wiring 152a. In addition, the bent part of the wiring 152a overlaps the bent part of the wiring 151a in the region 140A where the wiring 151a and the wiring 152a intersect each other.

The wiring 151a overlaps the corner parts 162a to 162d of the bent part of the wiring 152a. In addition, the wiring 152a overlaps the corner parts 161a to 161d of the bent part of the wiring 151. Here, the corner parts 161a to 161d of the bent part of the wiring 151a are chamfered. In addition, the corner parts 162a to 162d of the bent part of the wiring 152a are chamfered. Here, chamfered refers to a shape in which the corner part of the wiring is oblique. In other words, the corner parts 161a to 161d of the bent part of the wiring 151a each have an apex with an obtuse angle, and the corner parts 162a to 162d of the bent part of the wiring 152a each have an apex with an obtuse angle. Furthermore, in FIG. 8, the two-dot chain line indicates the corner part of a bent part, and the solid line and the dotted line indicate the shapes of the actual wiring 151a and the wiring 152a.

Therefore, even if the substrate 101 is folded in the folding region 120, by making the apex of the corner part of the bent part into a shape which has an obtuse angle in the region where the wiring 151a and the wiring 152a intersect, stress concentration on the obtuse apex part is avoided, and it is possible to further disperse the stress applied to the wiring 152a. Therefore, disconnection of the wiring 152a due to the wiring 151a does not easily occur. In addition, since the wiring 152a is does not easily disconnect, it is possible to improve the reliability of the display device 100.

Fourth Embodiment

Figure 9:
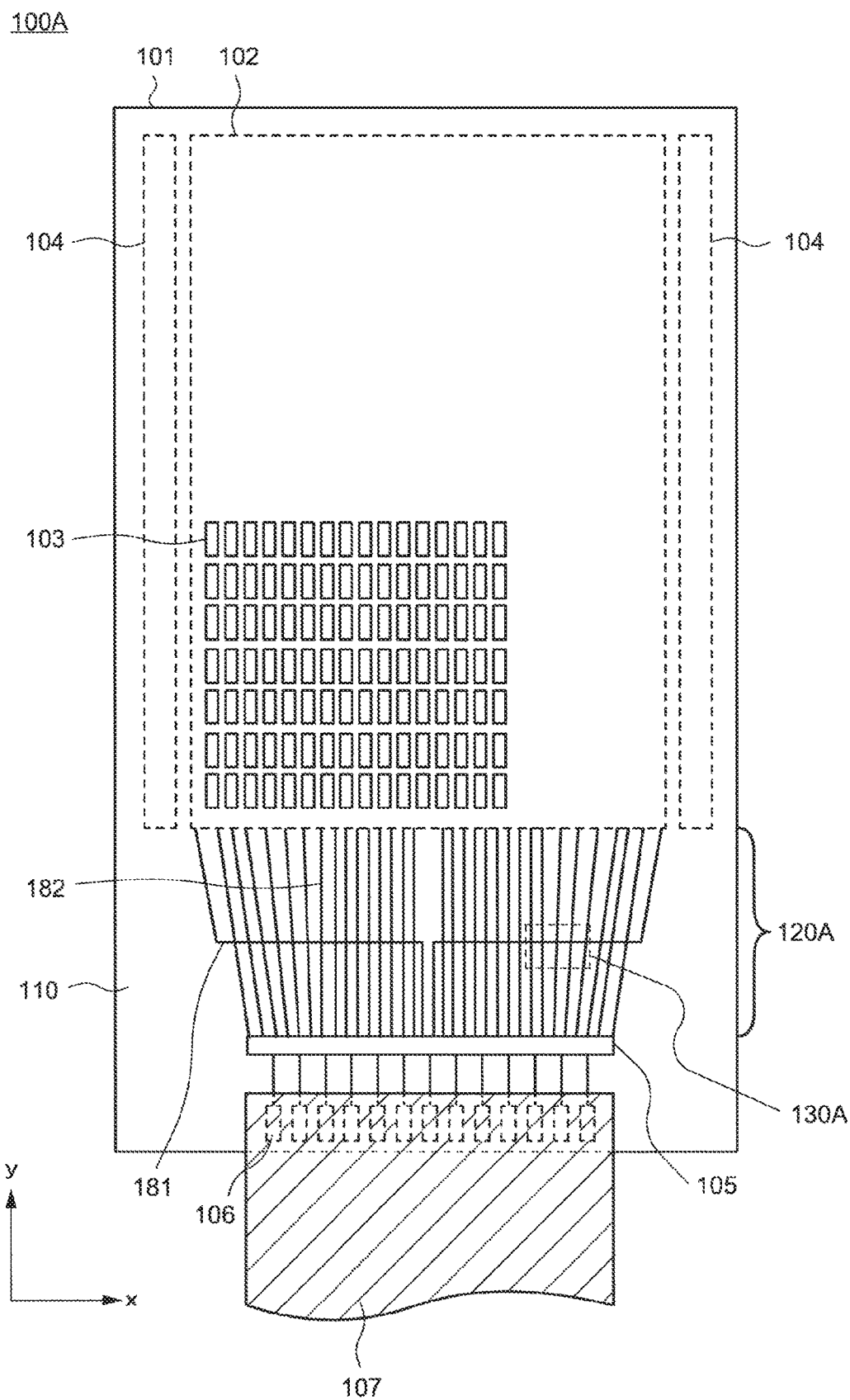
FIG. 9 is a plan view for explaining the structure of a display device related to one embodiment of the present invention.
Figure 10:
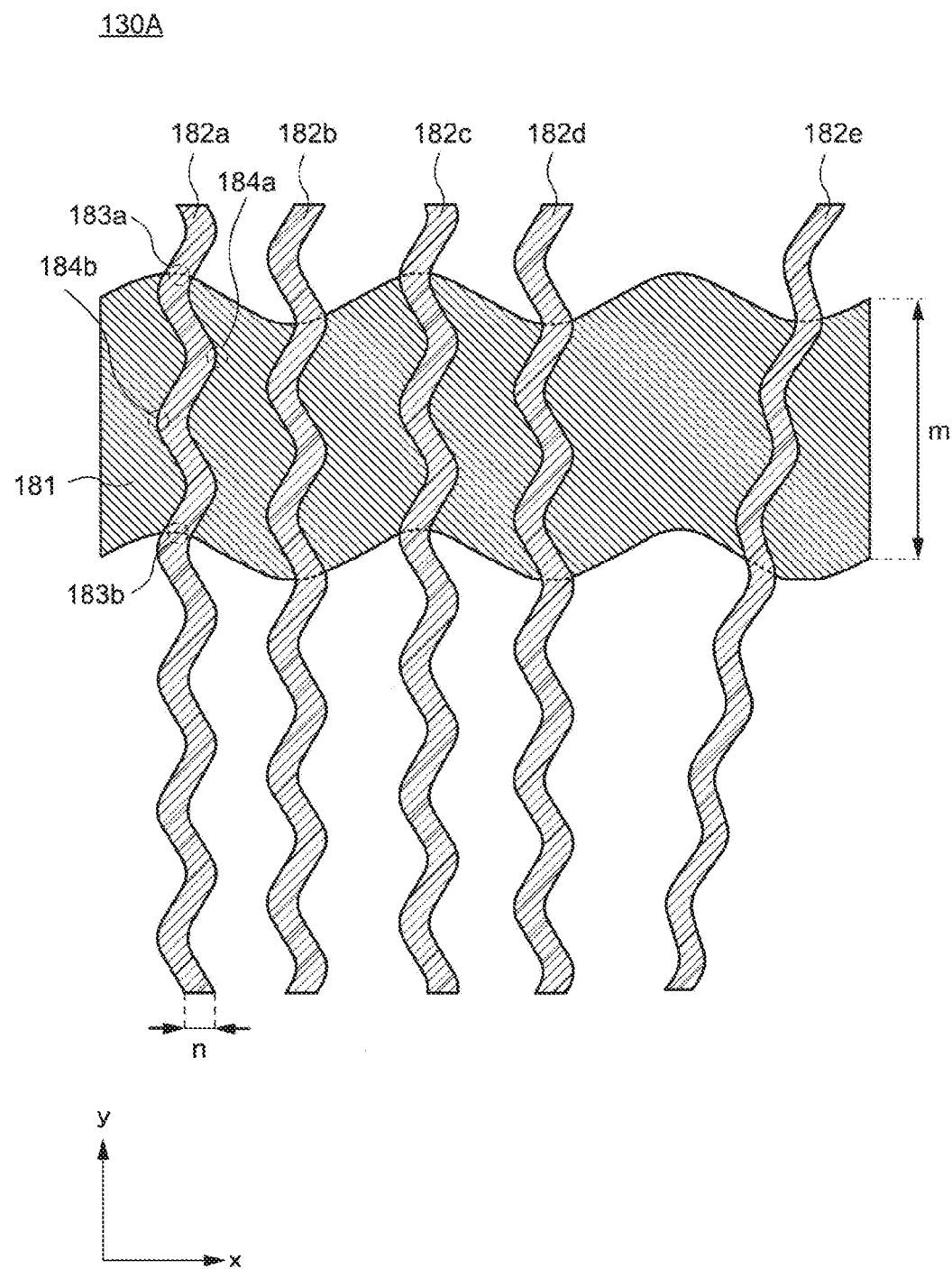
FIG. 10 is an enlarged view of a part of a display device related to one embodiment of the present invention.

In the present embodiment, a display device 100A having a structure which is partially different from the display device 100 shown in the first embodiment is explained while referring to FIG. 9 and FIG. 10. An explanation of the same structure as that of the display device 100 shown in FIG. 1 is omitted.

FIG. 9 is a plan view showing a structure of the display device 100A according to the present embodiment. In the display device 100A shown in FIG. 9, the structure of the folding region 120A is partially different from the structure of the folding region 120 of the display device 100 shown in FIG. 1. Specifically, the structure of a wiring 181 and a wiring 182 is different from the structure of the wiring 111 and the wiring 112 shown in FIG. 1.

FIG. 10 is an enlarged view of a region 130A shown in FIG. 9. As shown in FIG. 10, the wiring 181a is arranged in the first direction and the wiring 182a to 182e is arranged in the second direction. Furthermore, an insulating layer is arranged between the wiring 181a and the wirings 182a to 182e. The width m of the wiring 181a is larger than the width n of the wiring 182a. In this way, the width m of the wiring 181 which extend in the first direction may be different from the width n of the wirings 182a to 182e which extend in the second direction.

The wiring 181 has at least one bent part. In addition, each of the wirings 182a to 182e has at least one bent part. In addition, the wiring 181 overlaps, for example, a bent part of the wiring 182a in a region where the wiring 181a and the wiring 182a intersect each other.

As shown in FIG. 10, the wiring 181a overlaps at least the corner parts 184a and 184b of the bent part of the wiring 182a. In addition, the wiring 182a overlaps the corner parts 183a and 183b of the bent part of the wiring 181a. Here, the corner parts 183a, 183b of the bent part of the wiring 181a are rounded. In addition, the corner parts 184a, 184b of the bent part of the wiring 182a are rounded. Here, the fact that the corner parts are rounded means that the corner parts of the wiring are not a shape which has an obtuse apex but has a curve. That is, the wiring 181a does not overlap a linear region of the wiring 182a, and the wiring 182a does not overlap a linear region of the wiring 181a.

Therefore, even if the substrate 101 is folded in the folded region 120A shown in FIG. 9, by not arranging the corner parts of a bent part with an obtuse apex in a region where the wiring 181a and the wiring 182a intersect each other, stress concentration on the obtuse apex part is avoided and it is possible to disperse stress applied to the wiring 182a. Therefore, disconnection of the wiring 182a due to the wiring 181a does not easily occur. In addition, since the wiring 182a does not easily disconnect, it is possible to improve the reliability of the display device 100A.

Fifth Embodiment

In the present embodiment, a display device 100B which has a structure partially different from the display device 100 described in the first embodiment is explained while referring to FIG. 11 to FIG. 15. An explanation of the same structure as that of the display device 100 shown in FIG. 1 is omitted.

Figure 11:
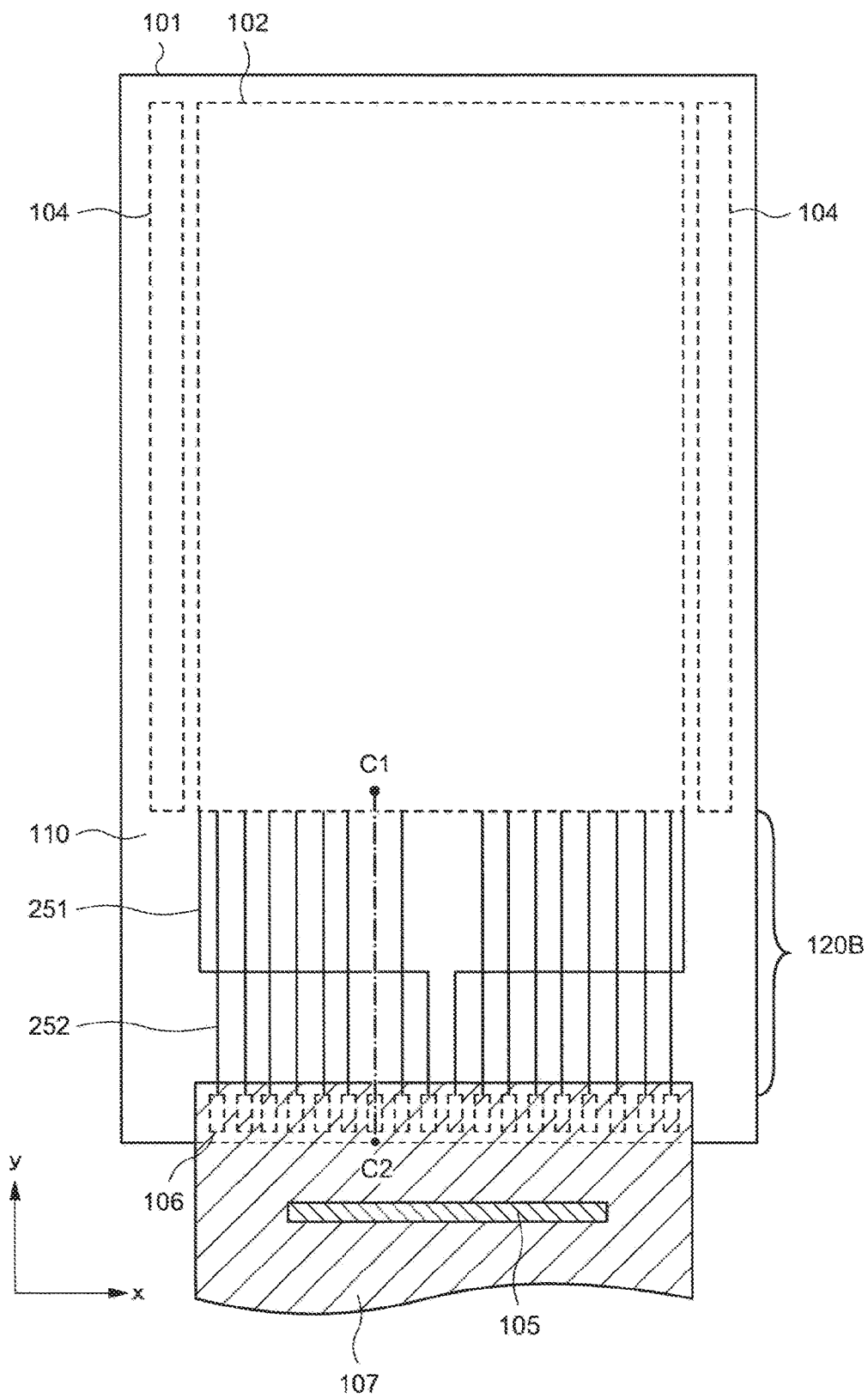
FIG. 11 is a plan view for explaining the structure of a display device related to one embodiment of the present invention.

Although the driver IC 105 is arranged in the periphery region 110 in the display device 100 shown in FIG. 1, in FIG. 11, an example in which the driver IC 105 is arranged on the flexible printed circuit 107 is shown. In FIG. 11, the display region 102 and the flexible printed circuit 107 are electrically connected by a plurality of wirings.

Figure 12:
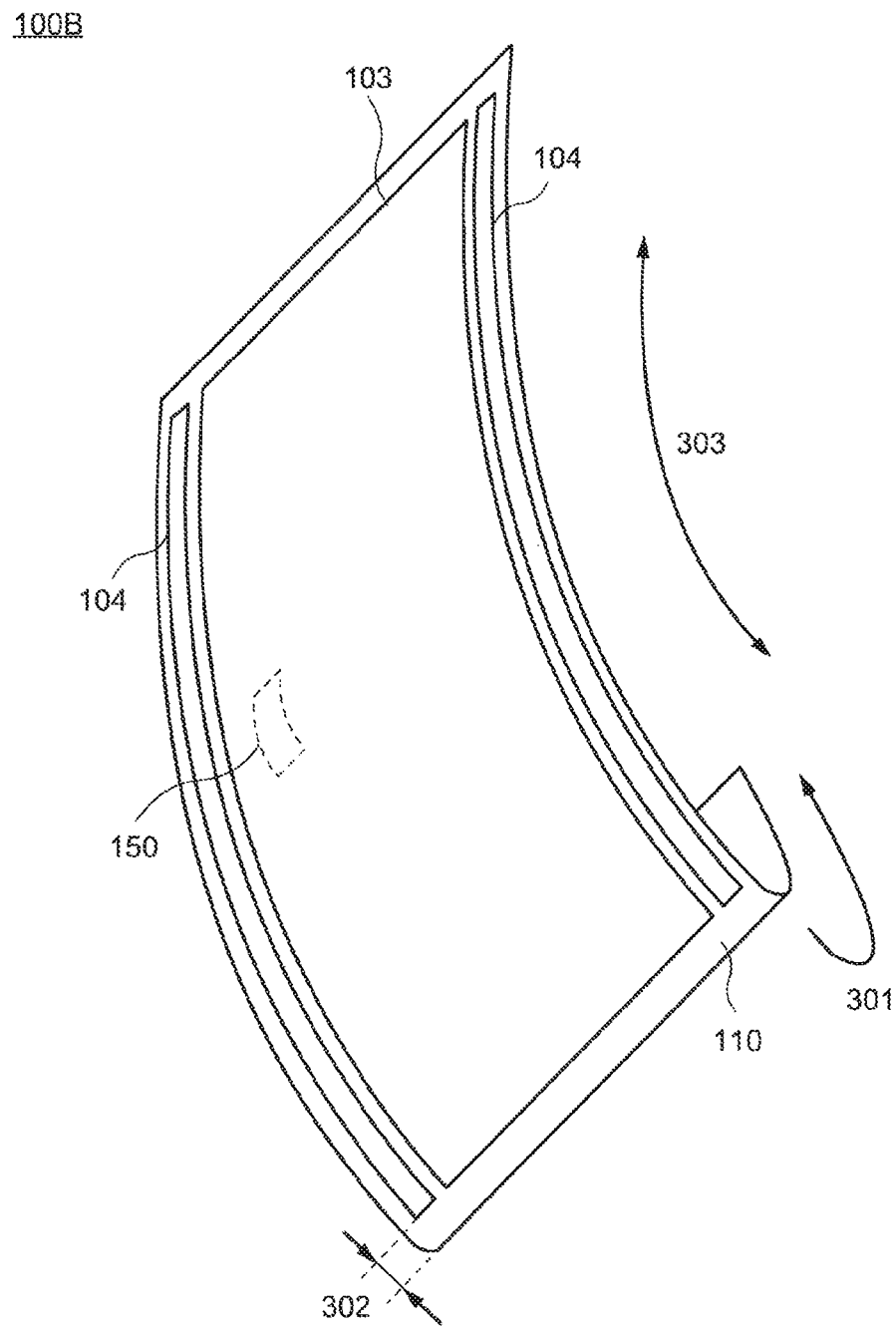
FIG. 12 is a perspective view for explaining the structure of a display device related to one embodiment of the present invention.

In the present embodiment, a structure in which the substrate 101 is curved in the display region 102 is explained. FIG. 12 is a perspective view showing a state in which the display device 100B is curved in one direction. Similar to the display device 100 shown in FIG. 3, the display device 100B is folded in the folding region 120B. In this way, the substrate 101 is folded so that the driver IC 105 and the flexible printed circuit 107 overlap the rear side of the display region 102. In addition, the display region 102 is curved in the direction of the arrow 303.

Stress occurs in the display region 102 by curving the display device 100B in the direction of the arrow 303. At this time, stress due to folding is concentrated in a region where a wiring extending in the first direction and a wiring extending in the second direction arranged in the display region 102 intersect each other.

Figure 13:
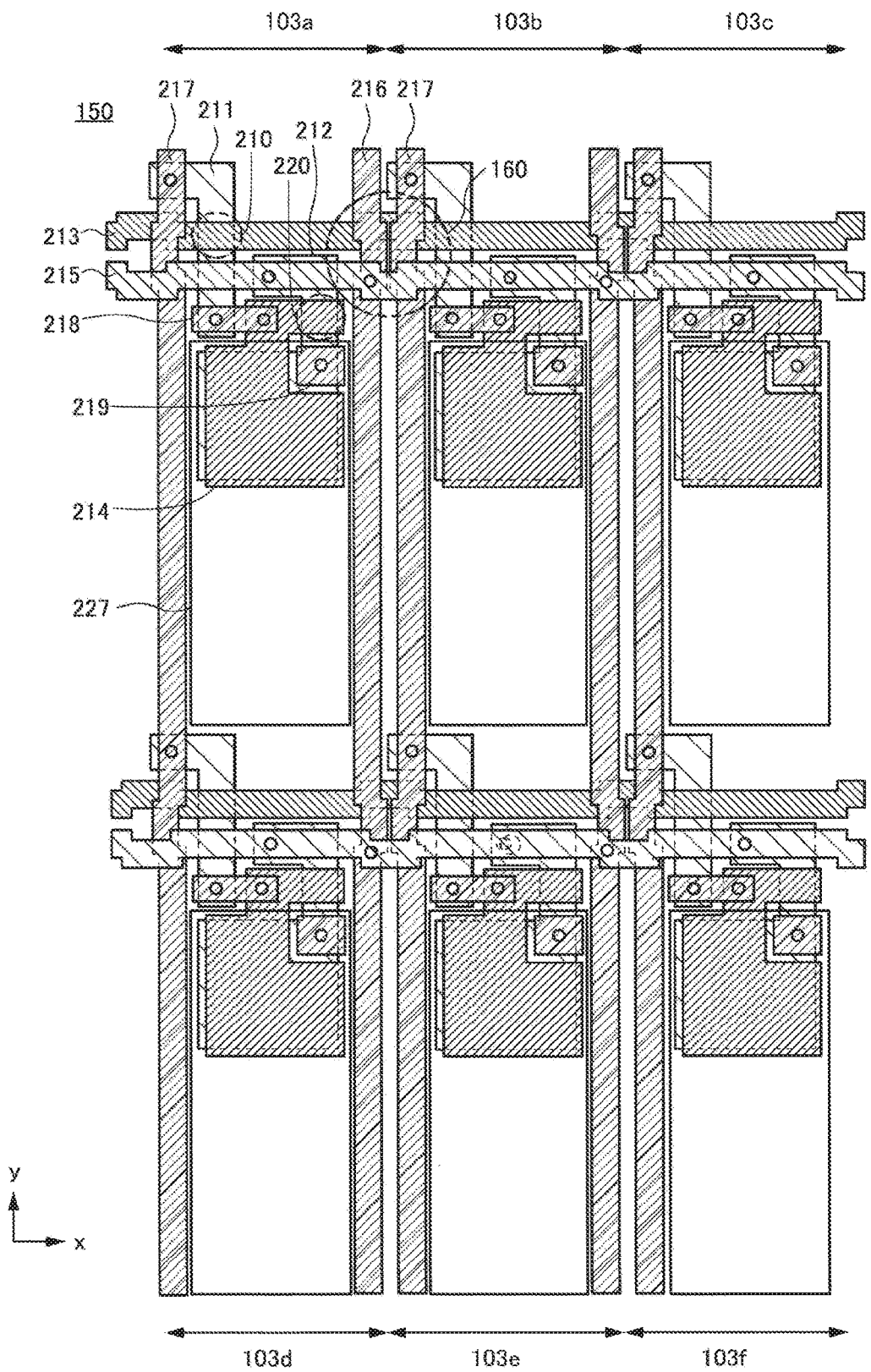
FIG. 13 is a plan view for explaining the structure of a display device related to one embodiment of the present invention.

FIG. 3 is an enlarged view of a region 150 shown in FIG. 12. Pixels 103a to 103f of 2 rows×3 columns are arranged in the region 150. FIG. 13 shows a conductive layer and a semiconductor layer which form the pixels 103a to 103f, and an illustration of an insulating film is omitted.

In FIG. 13, a pixel 103a includes a semiconductor layer 211, a semiconductor layer 212, wiring layers 213 and 215, a conductive layer 214, wiring layers 216 and 217, conductive layers 218 and 219 and a pixel electrode 227.

The wiring layer 213 and the conductive layer 214 are arranged above the semiconductor layer 211 and the semiconductor layer 212. In addition, the wiring layers 216 and 217 and conductive layers 218 and 219 are arranged above the wiring layers 213 and 215 and the conductive layer 214. In addition, the wiring layer 215 is arranged above the wiring layers 216 and 217. The pixel electrode 227 is arranged on the wiring layers 216 and 217 and the conductive layers 218 and 219.

The semiconductor layer 211 is connected to the wiring layer 217 and the conductive layer 218. The conductive layer 218 is connected to the conductive layer 214. The semiconductor layer 212 is connected to the wiring layer 215 and the conductive layer 219. The wiring layer 215 is connected to the wiring layer 217. The conductive layer 219 is connected to the pixel electrode 227.

A transistor 210 functions as a switching transistor. The wiring layer 213 functions as a gate and a scanning line of the transistor 210. In the semiconductor layer 211, a region where the wiring layer 213 overlaps functions as a channel region of the transistor 210. The wiring layer 217 functions as a source or drain of the transistor 210 and a signal line. The conductive layer 218 functions as a source or a drain.

A transistor 220 functions as a drive transistor. The conductive layer 214 functions as a gate of the transistor 220. In the semiconductor layer 212, a region where the conductive layer 214 overlaps functions as a channel region of the transistor 220. The wiring layer 215 functions as a power supply line connected to one of the source and the drain of the transistor 220. The conductive layer 219 is connected to the other of the transistor source or the drain and functions as connection wiring with a pixel electrode.

In FIG. 13, the wiring layer 213 and the wiring layer 215 are arranged in the first direction (x direction) of the display region 102, and the wiring layer 216 and the wiring layer 217 are arranged in the second direction (y direction) intersecting the first direction of the display region 102. That is, the wiring layer 213 intersects the wiring layer 217, and the wiring layer 213 and the wiring layer 216 intersect each other. The wiring layer 215 intersects with the wiring layer 217, and the wiring layer 215 and the wiring layer 216 intersect each other.

Figure 14:
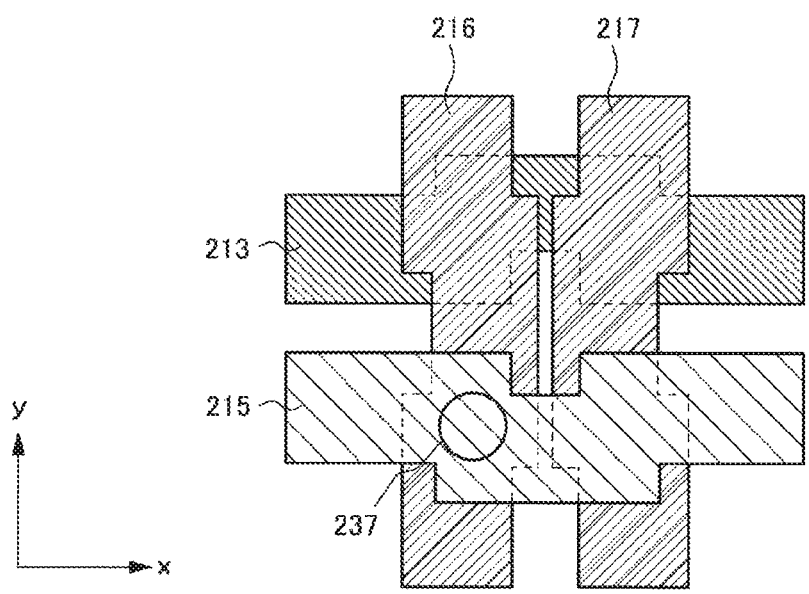
FIG. 14 is a plan view for explaining the structure of a display device related to one embodiment of the present invention.

FIG. 14 is an enlarged view of a region 160 where the wiring layers 213 and 215 extending in the first direction and the wiring layers 216 and 217 extending in the second direction intersect each other. An interlayer insulating film (not shown in the drawing) is arranged between the wiring layer 213 and the wiring layers 216 and 217. In addition, an interlayer insulating film is also arranged between the wiring layers 216 and 217 and the wiring layer 215. The wiring layer 215 is connected to the wiring layer 216 via an opening part 237 which is arranged in the interlayer insulating film.

Each of the wiring layers 213, 215, 216, and 217 includes two bent parts. The first bent part of the wiring layer 213 overlaps with the first bent part of the wiring layer 216 and the second bent part of the wiring layer 213 overlaps the first bent part of the wiring layer 217. In addition, the first bent part of the wiring layer 215 overlaps the second bent part of the wiring layer 216, and the second bent part of the wiring layer 215 overlaps the second bent part of the wiring layer 217.

It is possible to disperse stress which is applied to a wiring layer arranged in an upper layer in a region where two wiring layers intersect in the display region 102 shown in FIG. 14. Therefore, even when the substrate 101 is curved or folded in the display region 102, it is possible to suppress a stress concentration on the upper layer wiring layer due to the lower wiring layer. In this way, since disconnection of the wiring layer does not easily occur, it is possible to improve the reliability of the display device 100B.

In addition, in FIG. 14, for example, a corner part of the first bent part of the wiring layer 213 and the wiring layer 216 overlap in a region where the wiring layer 213 which extends in the first direction intersects with the wiring layer 216 which extends in the second direction. In this way, even if the substrate 101 is folded in the display region 102, it is possible to further disperse the stress applied to the wiring layer 216 in the region where the wiring layer 213 and the wiring layer 216 intersect. Therefore, disconnection of the wiring layer 216 due to the wiring layer 213 does not easily occur. In addition, since the wiring layer 216 does not easily disconnect, it is possible to improve the reliability of the display device 100B. Although not explained, the same applies to a region where the wiring layer 213 and the wiring layer 217 overlap, a region where the wiring layer 215 and the wiring layer 216 overlap, and a region where the wiring layer 215 and the wiring layer 217 overlap.

In addition, as shown in FIG. 7 of the second embodiment, the corner parts of the bent parts of the wiring layers 213, 215, 216 and 217 may be rounded. In addition, as shown in FIG. 8 of the third embodiment, the corner parts of the bent parts of the wiring layers 213, 215, 216 and 217 may be chamfered. Here, chamfered refers to a shape in which the corner part of the wiring is oblique. In other words, the corner parts of the bent parts of the wiring layers 213, 215, 216 and 217 may each have an apex with an obtuse angle. In this way, even when the substrate 101 is folded in the display region 102, it is possible to further disperse stress applied to the wiring layer 216 in a region where the wiring layer 213 and the wiring layer 216 intersect for example. Therefore, disconnection of the wiring layer 216 due to the wiring layer 213 does not easily occur. In addition, since the wiring layer 216 does not easily disconnect, it is possible to improve the reliability of the display device 100B. Although an explanation is omitted, the same applies to a region where the wiring layer 213 and the wiring layer 217 overlap, a region where the wiring layer 215 and the wiring layer 216 overlap, and a region where the wiring layer 215 and the wiring layer 217 overlap.

Figure 15:
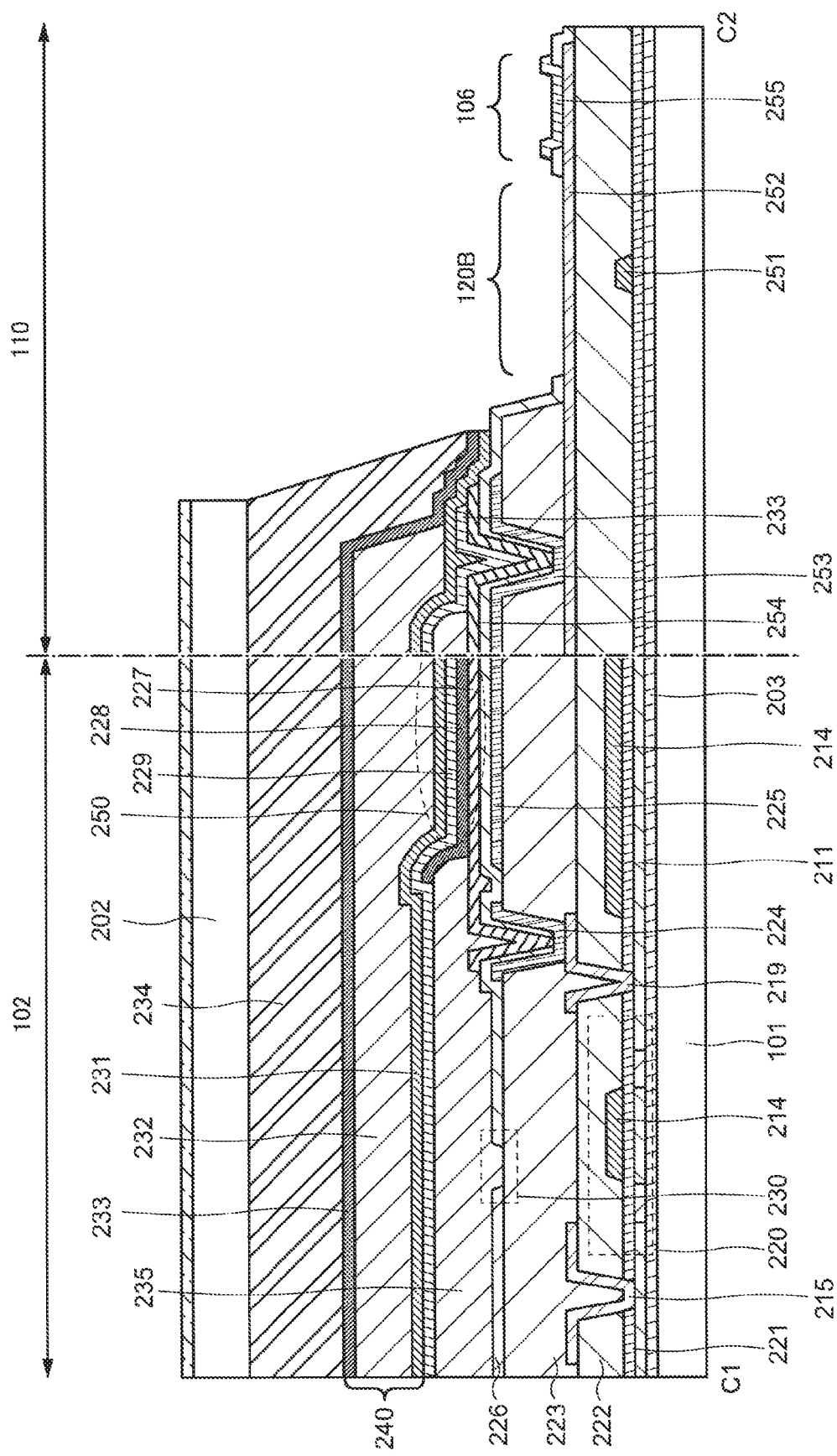
FIG. 15 is a cross-sectional view for explaining the structure of a display device related to one embodiment of the present invention.

FIG. 15 is a cross-sectional view of the display region 102 and the periphery region 110 in the display device 100B shown in FIG. 11.

It is possible to use a flexible substrate such as polyimide as the substrate 101 and a counter substrate 202. However, as a bendable sheet display, other resin materials may be used as a foldable sheet display as long as they have sufficient flexibility.

An undercoat layer 203 is arranged above the substrate 101. For example, a silicon oxide film and a silicon nitride film can be used for the undercoat layer 203. The undercoat layer 203 is arranged with a three-layer structure of, for example, a silicon oxide film, a silicon nitride film and a silicon oxide film. The silicon oxide film on the lowermost layer can improve adhesion to the substrate 101. In addition, the silicon nitride film of the middle layer can suppress the entrance of moisture and impurities from the outside. In addition, the silicon oxide film on the uppermost layer can suppress hydrogen atoms contained in the silicon nitride film from diffusing into the semiconductor layer 211. The undercoat layer 203 is not limited to the three-layer structure described above. The undercoat layer 203 may also have a stacked structure of four or more layers or may have a single layer structure or a two-layer structure.

In FIG. 15, a part of a pixel 103 is shown as the display region 102. The pixel 103 includes a transistor 220 arranged above the undercoat layer 203 and a light emitting element 250 which is electrically connected to the transistor 220.

In the present embodiment, the transistor 220 includes the semiconductor layer 211 arranged above the undercoat layer 203, a gate insulating film 221 covering the semiconductor layer 211, and a conductive layer 214 arranged above the gate insulating film 221. The conductive layer 214 functions as a gate electrode. An interlayer insulating film 222 is arranged above the transistor 220 to cover the conductive layer 214. A wiring layer 215 and a conductive layer 219 are arranged above the interlayer insulating film 222. In addition, the wiring layer 215 and the conductive layer 219 are connected to the semiconductor layer 211 via an opening part arranged in the interlayer insulating film 222.

The material of each layer which forms the transistor 220 may be any known material and is not particularly limited. Polysilicon, amorphous silicon or an oxide semiconductor can be used as the semiconductor layer 211. Silicon oxide or silicon nitride can be used as the gate insulating film 221. In addition, a metal material such as copper, molybdenum, tantalum, tungsten, or aluminum may be used to form the conductive layer 214. Silicon oxide or silicon nitride can be used as the interlayer insulating film 222. The wiring layer 215 and the conductive layer 219 are each formed by a metal material such as copper, titanium, molybdenum or aluminum.

A thin film transistor (TFT) is shown as the transistor 220. However, the transistor 220 is not limited to a thin film transistor, and any element may be used as long as it includes a current control function. Although an example in which an n-channel transistor is used for the transistor 220 is shown in FIG. 14, a p-channel transistor may also be used.

A planarization film 223 is arranged above the interlayer insulating film 222, the wiring layer 215 and the conductive layer 219. The planarization film 223 is formed using an organic resin material. For example, polyimide, polyamide, acrylic or epoxy and the like can be used as the organic resin material. These materials are capable of film forming by a solution coating method and have the feature of a high flattening effect. Furthermore, the planarization film 223 is not arranged in the periphery region 110.

The planarization film 223 is arranged with an opening part. The conductive layer 219 is connected to a conductive layer 224 via the opening part of the planarization film 223. In addition, a conductive layer 225 is arranged above the planarization film 223. For example, an indium oxide based transparent conductive film (for example, ITO) or a zinc oxide based transparent conductive film (for example, IZO, ZnO) can be used as the transparent conductive film for the conductive layer 224 and the conductive layer 225.

An insulating layer 226 is arranged above the planarization film 223 and the conductive layers 224 and 225. The insulating layer 226 is formed using, for example, a silicon nitride film or a silicon oxide film. A pixel electrode 227 is arranged on the insulating layer 226. The pixel electrode 227 is connected to the conductive layer 224 via an opening part arranged in the insulating layer 226. An insulating layer 235 is arranged to cover the end part of the pixel electrode 227. The insulating layer 235 is also called a partition wall or a bank. Similar to the planarization film 223, photosensitive acrylic can be used as the insulating layer 235. It is preferred that the insulating layer 235 be opened so that the pixel electrode 227 is exposed and the end part of the opening has a gentle tapered shape. When the end part of the opening has a steep shape, coverage defects of an organic layer 228 formed later occur.

In addition, the insulating layer 226 is arranged with an opening part 230, and the planarization film 223 and the insulating layer 235 are in contact with each other in the opening part 230. In this way, moisture and gas desorbed from the planarization film 223 can be released through the insulating layer 235 by a heat treatment after the formation of the insulating layer 235.

After formation of the insulating layer 235, a plurality of organic materials which form the organic layer 228 are stacked. The organic layer 228 is formed by stacking a hole transporting layer, a light emitting layer and an electron transporting layer in this order from the pixel electrode 227 side. These layers may be formed by vapor deposition or by coating formation after solvent dispersion. In addition, the organic layer 228 may be selectively formed for each subpixel or may be formed on the entire surface of the display region 102. In the case of forming the organic layer 228 on the front surface, it is possible to adopt a structure in which white light is emitted in all pixels and a desired color wavelength part is extracted using a color filter (not shown in the drawing).

A counter electrode 229 is formed after forming the organic layer 228. Since a top emission structure is adopted in the present embodiment, it is necessary for the counter electrode 229 to have translucency. In the case when MgAg is used as the counter electrode 229, it is formed using a thin film to the extent that light emitted from the organic layer 228 passes through. The light emitting element 250 is formed by the pixel electrode 227, the organic layer 228 and the counter electrode 229. In the case of a top emission structure, the pixel electrode 227 serves as an anode and the counter electrode 229 serves as a cathode. The counter electrode 229 is formed above the display region 102 and across a cathode contact part arranged in the periphery region 110. In the cathode contact part, the counter electrode 229 is connected to a wiring layer 252 via a conductive layer 254 and a conductive layer 253 and is electrically connected to the terminal 106.

A sealing film 240 is arranged above the counter electrode 229. The sealing film 240 is arranged to suppress moisture entering from the outside from entering the organic layer 228. Therefore, a material having high gas barrier properties is preferred as the sealing film 240. In FIG. 14, an example is shown in which the sealing film 240 is formed with a three-layer structure of an inorganic insulating layer 231, an organic insulating layer 232 and an inorganic insulating layer 233. It is preferred to use silicon nitride as the inorganic insulating layers 231 and 233 and an organic resin as the organic insulating layer 232. Furthermore, a silicon oxide film or an amorphous silicon film may be arranged between the silicon nitride and the organic resin. In this way, adhesion can be improved.

A filler 234 is arranged above the inorganic insulating layer 233. For example, acrylic, rubber, silicone, or urethane adhesive materials can be used for the filler 234. In addition, a spacer may be arranged in the filler 234 in order to secure a gap between the substrate 101 and the counter substrate 202. This spacer may be mixed into the filler 234 or may be formed from a resin or the like on the substrate 101.

For example, an overcoat layer may be arranged having a flattening effect on the counter substrate 202. In the case when the organic layer 228 emits white light, a color filter corresponding to each color of RGB and a black matrix arranged between the color filters may be formed on a main surface (surface facing the substrate 101) on the counter substrate 202. In the case where a color filter is not formed on the counter substrate 202 side, for example, a color filter may be directly formed on the inorganic insulating layer 233 and the filler 234 may be formed above the color filter. Furthermore, the organic insulating layer 232 has a planarization effect, and each layer above the organic insulating layer 232 is formed flat. As a result, the organic insulating layer 232 is thick above the light emitting element 250 and thin above the insulating layer 235.

In FIG. 14, the wiring layer 252 and a conductive layer 255 form the terminal 106. The conductive layer 255 is, for example, a film formed in the same step as the counter electrode 229.

In the display device 100B according to the present embodiment, the bent parts of the wiring layers overlap each other in a region where two wiring layers intersect. In this way, even when the substrate 101 is curved or folded in the display region 102, it is possible to suppress stress concentration on an upper wiring layer due to a lower wiring layer. In this way, since disconnection of the wiring layer does not easily occur, it is possible to improve reliability of the display device 100B.

In addition, as shown in FIG. 11 and FIG. 15, the wiring layer 251 and the wiring layer 252 intersect in the folding region 120B. Similar to the previous embodiment, in the region where the wiring layer 251 and the wiring layer 252 intersect each other, the bent parts of the wiring layers overlap each other. In this way, even when the substrate 101 is bent or folded in the folding region 120B, it is possible to suppress stress concentration on the wiring layer 252 due to the wiring layer 251. In this way, disconnection of the wiring layer does not easily occur, and it is possible to improve the reliability of the folding region 120B.

As was explained in the present embodiment, resistance to bending or folding of the substrate 101 is improved not only in the folding region 120B but also in the display region 102 of the display device 100B.

Sixth Embodiment

Figure 16:
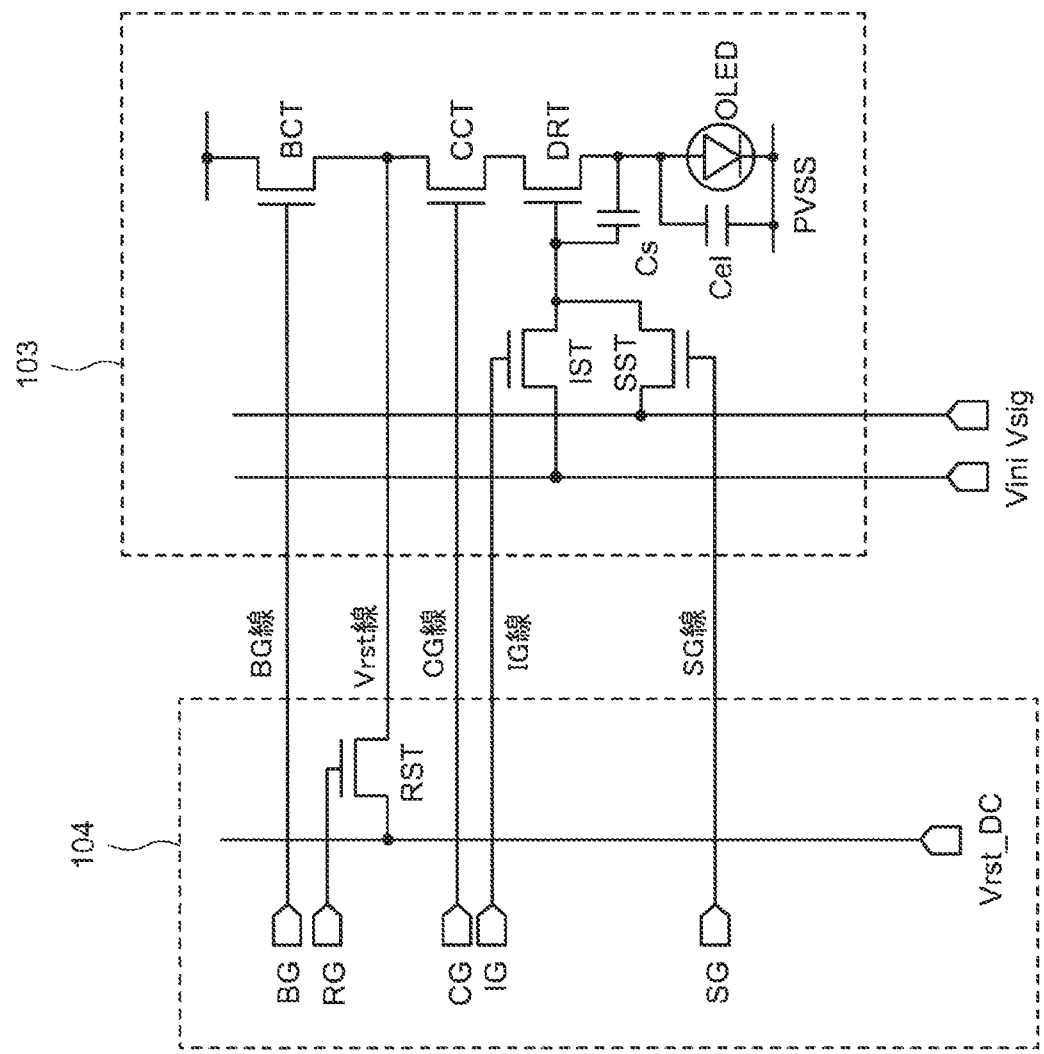
FIG. 16 is a circuit drawing of a display device related to one embodiment of the present invention.

In the present embodiment, a pixel which is partially different from the pixel shown in the fifth embodiment is explained while referring to FIG. 16 and FIG. 17.

FIG. 16 is an equivalent circuit drawing of a pixel. As shown in FIG. 16, the pixel 103 and the drive circuit 104 are connected by a plurality of wirings. Signals are provided from the drive circuit 104 to the pixel 103 via a gate light emission control scanning line BG, a reset control scanning line RG, a correction control scanning line CG, an initialization control scanning line IG, and a write control scanning line SG respectively. In addition, a light emission control transistor BCT, a correction transistor CCT, an initialization transistor IST, a write transistor SST, and a drive transistor DRT are arranged in the pixel 103. Some of the transistors may be shared between a plurality of adjacent pixels. For example, one reset transistor RST is arranged in each row in the periphery region 110. A storage capacitor Cs may also be arranged between the gate and the source of the drive transistor DRT. A capacitor Cel is a parasitic capacitance between the anode and the cathode of the light emitting element OLED.

A high potential side power supply PVDD is supplied to the anode of the light emitting element OLED via the light emission control transistor BCT, the correction transistor CCT and the drive transistor DRT. In addition, a low potential side power supply PVSS is supplied to the cathode of the light emitting element OLED. The light emission control transistor BCT, the correction transistor CCT, the initialization transistor IST and the write transistor SST function as switching elements for selecting conduction or non-conduction between two nodes. The drive transistor DRT functions as a current control element for controlling the value of a current which flows in the light emitting element OLED according to the voltage between the gate and the source. The light emission control transistor BCT, the correction transistor CCT, the initialization transistor IST and the write transistor SST are formed using a thin film transistor (TFT). In addition, although each of the plurality of TFTs used for a pixel is formed using an n-channel transistor, they may also be formed using a p-channel transistor. In the case when a p-channel transistor is used, connection of the power supply potential and holding capacity may be suitably adapted.

FIG. 17 is a timing chart of the drive circuit 104 for driving a pixel shown in FIG. 16. Each period shown by the time periods G1 to G4 is one horizontal period, and although omitted hereafter, continues until the last row. The time period indicated by T0 to T6 in FIG. 17 is explained in detail while referring to FIG. 16.

T0: Previous Frame Light Emission

In the time period T0, the light emitting element OLED continues a light emitting state of the previous frame until processing in a certain frame time period is started.

T1: Initialization of Drive Transistor DTR Source

In the time period T1, the potential of the gate light emission control scanning line BG is a Low level (referred to as L level below), the potential of the reset control scanning line RG is a High level (referred to as H level below), and the potential of the correction control scanning line CG is a H level. In this way, the light emission control transistor BCT is turned OFF, the correction transistor CCT is turned ON, and the reset transistor RST is turned ON. In each pixel of this row, the current from the high potential power supply PVDD is blocked by the light emission control transistor BCT. In addition, the light emission of the light emitting element OLED is stopped, and an electric charge remaining within the pixel 103 is extracted through the reset transistor RST. In this way, the source of the drive transistor DRT is fixed to a reset potential Vrst. The reset potential Vrst is set to a lower potential than the emission start voltage of the light emitting element OLED with respect to the low potential side power supply PVSS.

T2: Initialization of Drive Transistor DTR Gate

In the time period T2, the potential of the initialization control scanning line IG becomes an H level, and the initialization transistor IST turns ON. In each pixel of this row, the gate of the DRT is fixed to the initialization potential Vini via the initialization transistor IST. The initialization potential Vini is set to a larger potential than the threshold value of the drive transistor DRT with respect to the reset potential Vrst. That is, the drive transistor DRT is turned ON by this operation. However, since the light emission control transistor BCT is OFF, a current does not flow to the drive transistor DRT.

T3: Offset Cancel Operation

In the time period T3, the potential of the gate emission control scanning line BG becomes an H level and the potential of the reset control scanning line RG becomes an L level. In this way, the light emission control transistor BCT is turned ON and the reset transistor RST is turned OFF. Since the drive transistor DRT is in an ON state by the previous operation, a current is supplied from the light emitting control transistor BCT and the high potential side power supply PVDD to the drive transistor DRT through the correction transistor CCT. At this stage, a current does not flow since the voltage between the anode and the cathode of the light emitting element OLED does not exceed the light emission start voltage. Therefore, the source of the drive transistor DRT is charged by the current supplied from the high potential side power source PVDD, and the potential thereof increases. At this time, the gate potential of the drive transistor DRT is the initialization potential Vini. Therefore, when the potential of the source of the drive transistor DRT becomes (Vini-Vth), the drive transistor DRT turns OFF, and the increase of the potential stops. Since the threshold voltage Vth of the drive transistor DRT varies from pixel to pixel, the potential of the source of the drive transistor DRT when the increase of the potential stops varies depending on the pixel. That is, a voltage corresponding to the threshold voltage Vth of the drive transistor DRT is obtained in each pixel by this operation. At this time, although a voltage of {(Vini-Vth)-PVSS} is applied between the anode and cathode of the light emitting element OLED, since this voltage still does not exceed the light emission start voltage, a current does not flow to the light emitting element OLED.

Furthermore, in the timing chart of FIG. 17, although the operations in the time periods T1 to T3 are executed in parallel for every two rows, the present invention is not limited to this. The operations may also be performed in sequence for every one row or in parallel for every three or more rows.

T4, T5: Image Signal Writing Operation

In the time period T3 and the time period T4, the potential of the correction control scanning line CG is an L level, the potential of the initialization control scanning line IG is an L level, and the potential of the write control scanning line SG is an H level. In this way, the correction transistor CCT is turned OFF, the initialization transistor IST is turned ON, and the write transistor SST is turned ON. In each pixel of this row, the potential of the image signal line Vsig is input to the gate of the drive transistor DRT. The gate potential of the drive transistor DRT changes from the initialization potential Vini to the potential of the image signal Vsig. On the other hand, the source potential of the drive transistor DRT is still (Vini-Vth), and as a result, the gate/source voltage of the drive transistor DRT becomes {Vsig-(Vini-Vth)}, which reflects the variation in threshold value between pixels.

Since the image signal line Vsig is common to pixels of a plurality of rows belong to the same column, an image signal write operation is executed in sequence for each individual row.

T6: Light Emitting Operation

In the time period T6, the potential of the correction control scanning line CG is an H level and the potential of the write control scanning line SG is a L level. In this way, the correction transistor CCT is turned ON and the write transistor SST is turned OFF. A current is supplied from the high potential side power supply PVDD to the drive transistor DRT through the light emission control transistor BCT and the correction transistor CCT. The drive transistor DRT supplies a current corresponding to the gate/source voltage which is set up to the previous stage to the light emitting element OLED, and the light emitting element OLED emits light with a luminosity corresponding to the current. At this time, although the potential on the anode side increases since the voltage between the anode and the cathode of the light emitting element OLED becomes a voltage corresponding to the current, the voltage between the gate and the source of the drive transistor DRT is held by the capacitor Cs. As a result, as the potential on the anode side increases, the gate potential of the drive transistor DRT also increases due the coupling of the capacitor Cs. Actually, not only the capacitor Cs but also the additional capacitor Cad and other parasitic capacitance are attached to the gate of the drive transistor DRT. Therefore, although the increase in the gate potential of the drive transistor DRT is slightly smaller than the increase of the potential on the anode side, since this value is known, the potential of the image signal line Vsig may be determined so that the desired current value can be obtained in the final voltage between the gate/source of the drive transistor DRT.

A series of operations of the pixel is completed by the above. When these operations are completed from a first row to the final row, one pixel is displayed within one frame time period. Following this, the operations are repeated and display of an image is performed.

Those skilled in the art could appropriately add, delete or change the design of the constituent elements as appropriate based on the display device explained as an embodiment or example of the present invention, or add, omit or change conditions as long as it does not depart from the concept of the present invention such changes are included within the scope of the present invention. In addition, each embodiment described above can be implemented in combination as long as they are within a scope that does not produce a technical contradiction.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A display device comprising:
    a substrate having flexibility;
    a display region including a plurality of pixels above the substrate;
    a periphery region on an outer side of the display region above the substrate;
    a terminal arranged in the periphery region;
    a folding region between the display region and the terminal in the periphery region;
    a first wiring arranged in the folding region and extending in a first direction;
    a first insulation layer above the first wiring; and
    a second wiring arranged in the folding region and extending in a second direction intersecting the first direction above the first insulation layer,
    wherein
    the terminal overlaps the display region, when the substrate is folded in the folding region;
    the first wiring includes a first bent part;
    the first bent part has four corner parts;
    the second wiring includes a second bent part;
    the second bent part has four corner parts; and
    the four corner parts of the first bent part overlaps the second wiring and the four corner parts of the second bent part overlaps the first wiring in a region where the first wiring and the second wiring intersect.

2. The display device according to claim 1, wherein the four corner parts of the first bent part includes at least one first curved angle part, the four corner parts of the second bent part includes at least one second curved angle part, the first wiring overlaps with the second curved angle part, and the second wiring overlaps with the first curved angle part.

3. The display device according to claim 2, wherein the first curved angle part and the second curved angle part are each rounded respectively.

4. The display device according to claim 2, wherein
    each of the first curved angle part and the second curved angle part has a plurality of apexes, and
    each of inner angles of the plurality of apexes is an obtuse angle.

5. The display device according to claim 1, further comprising
    a driver IC arranged in the periphery region and electrically connected with the plurality of pixels via the second wiring, and
    the terminal electrically connected with the driver IC.

6. The display device according to claim 1, wherein a width of the first wiring is larger than a width of the second wiring.

7. A display device comprising
    a substrate having flexibility;
    a display region including a plurality of pixels above the substrate;
    a periphery region on an outer side of the display region above the substrate;
    a first wiring arranged in the display region and extending in a first direction;
    a first insulation layer above the first wiring; and
    a second wiring arranged in the display region and extending in a second direction intersecting the first direction above the first insulation layer,
    wherein
    the first wiring includes a first bent part;
    the first bent part has four corner parts;
    the second wiring includes a second bent part;
    the second bent part has four corner parts; and
    the four corner parts of the first bent part overlaps the second wiring and the four corner parts of the second bent part overlaps the first wiring in a region where the first wiring and the second wiring intersect.

8. The display device according to claim 7, wherein the four corner parts of the first bent part includes at least one first curved angle part, the four corner parts of the second bent part includes at least one second curved angle part, the first wiring overlaps with the second curved angle part, and the second wiring overlaps with the first curved angle part.

9. The display device according to claim 8, wherein the first curved angle part and the second curved angle part are each rounded respectively.

10. The display device according to claim 8, wherein
each of the first curved angle part and the second curved angle part has a plurality of apexes, and
each of inner angles of the plurality of apexes is an obtuse angle.

11. The display device according to claim 7, further comprising
a driver IC arranged in the periphery region and electrically connected with the plurality of pixels via the second wiring.

* * * * *